United States Patent
Sawa

(10) Patent No.: US 9,837,593 B2
(45) Date of Patent: Dec. 5, 2017

(54) THERMOELECTRIC CONVERSION MATERIAL, THERMOELECTRIC CONVERSION MODULE USING THE SAME, AND MANUFACTURING METHOD OF THE SAME

(71) Applicants: Kabushiki Kaisha Toshiba, Tokyo (JP); Toshiba Materials Co., Ltd., Yokohama-shi (JP)

(72) Inventor: Takao Sawa, Yokohama (JP)

(73) Assignees: Kabushiki Kaisha Toshiba, Minato-Ku (JP); Toshiba Materials Co., Ltd., Yokohama-shi (JP)

( * ) Notice: Subject to any disclaimer, the term of this patent is extended or adjusted under 35 U.S.C. 154(b) by 0 days.

(21) Appl. No.: 14/583,329

(22) Filed: Dec. 26, 2014

(65) Prior Publication Data

US 2015/0107641 A1    Apr. 23, 2015

Related U.S. Application Data

(63) Continuation of application No. PCT/JP2013/068739, filed on Jul. 9, 2013.

(30) Foreign Application Priority Data

Jul. 10, 2012    (JP) .................. 2012-154978

(51) Int. Cl.
*H01L 35/00* (2006.01)
*H01L 35/18* (2006.01)
(Continued)

(52) U.S. Cl.
CPC .............. *H01L 35/18* (2013.01); *C22C 19/03* (2013.01); *C22C 19/07* (2013.01); *H01L 35/32* (2013.01); *H01L 35/34* (2013.01)

(58) Field of Classification Search
CPC ......... H01L 35/18; H01L 35/32; H01L 35/34; C22C 19/03; C22C 19/07
See application file for complete search history.

(56) References Cited

U.S. PATENT DOCUMENTS

2003/0234037 A1* 12/2003 Tanaka ................ H01L 35/32
                                                                          136/205
2005/0172994 A1    8/2005 Shutoh et al.
(Continued)

FOREIGN PATENT DOCUMENTS

CN      101043064 A     9/2007
CN      101449402 A     6/2009
(Continued)

OTHER PUBLICATIONS

Al2O3 material properties, www.accuratus.com/alumox.html.*
(Continued)

*Primary Examiner* — Matthew Martin
(74) *Attorney, Agent, or Firm* — Burr & Brown, PLLC

(57) ABSTRACT

A thermoelectric conversion material made of a polycrystalline material represented by a composition formula (1) shown below and having an MgAgAs type crystal structure is provided. An insulating coat is provided on at least one surface of the polycrystalline material. Composition formula (1): $(A_{a1}Ti_{b1})_x D_y X_{100-x-y}$, wherein $0.2 \leq a1 \leq 0.7$, $0.3 \leq b1 \leq 0.8$, $a1+b1=1$, $30 \leq x \leq 35$, $30 \leq y \leq 35$ hold, wherein A is at least one element selected from the group consisting of Zr and Hf, D is at least one element selected from the group consisting of Ni, Co, and Fe, and X is at least one element selected from the group consisting of Sn and Sb.

5 Claims, 2 Drawing Sheets

(51) Int. Cl.
*C22C 19/03* (2006.01)
*C22C 19/07* (2006.01)
*H01L 35/32* (2006.01)
*H01L 35/34* (2006.01)

(56) References Cited

U.S. PATENT DOCUMENTS

| | | |
|---|---|---|
| 2006/0151021 A1 | 7/2006 | Stark |
| 2007/0221264 A1 | 9/2007 | Shutoh et al. |
| 2008/0135082 A1 | 6/2008 | Hirono et al. |
| 2011/0298080 A1* | 12/2011 | Hiroyama ............... H01L 35/34 257/467 |
| 2013/0014796 A1* | 1/2013 | Tajima ................... H01L 35/32 136/203 |

FOREIGN PATENT DOCUMENTS

| | | |
|---|---|---|
| CN | 102282692 A | 12/2011 |
| CN | 102514282 A | 6/2012 |
| JP | H11-135843 A | 5/1999 |
| JP | 11-251647 A1 | 9/1999 |
| JP | H11-251647 A | 9/1999 |
| JP | 2000-286467 A | 10/2000 |
| JP | 2000-286467 A1 | 10/2000 |
| JP | 2003-197981 A1 | 7/2003 |
| JP | 2003-218412 A1 | 7/2003 |
| JP | 2004-228293 A1 | 8/2004 |
| JP | 2007-173799 A1 | 7/2007 |
| JP | 2007-258571 A1 | 10/2007 |
| JP | 2010-129636 A1 | 6/2010 |
| JP | 2010-165843 A | 7/2010 |
| JP | 2010-165843 A1 | 7/2010 |
| JP | 2011-003640 A1 | 1/2011 |
| WO | 2006/067986 A1 | 6/2006 |
| WO | 2009/001598 A1 | 12/2008 |
| WO | 2011/118341 A1 | 9/2011 |

OTHER PUBLICATIONS

International Preliminary Report on Patentability (Application No. PCT/JP2013/068739) dated Jan. 13, 2015 (in English).
International Search Report and Written Opinion (Application No. PCT/JP2013/068739) dated Sep. 3, 2013.
Japanese Office Action (Application No. 2014-524818) dated May 19, 2015.
Chinese Office Action (With English Translation), Chinese Application No. 201380028161.5, dated May 30, 2016 (22 pages).
Japanese Office Action (With English Translation), Japanese Application No. 2014-524818, dated Nov. 8, 2016 (13 pages).
Chinese Office Action, Chinese Application No. 201380028161.5, dated Apr. 28, 2017 (6 pages).
Report of Re-Examination (with English Translation), Japanese Application No. 2014-524818, dated Apr. 17, 2017 (9 pages).
Sakka, Sumio, et al. "VIII. Examples of Various Measurement Values," *Journal of the Ceramic Society of Japan*, The Ceramic Society of Japan, vol. 72, No. 829, dated 1964, pp. C765-C809 (45 pages).
Masuda, Hirohisa, et al., "A Medium-Range Structural Parameter of Oxide Glasses Based on Thermal Expansion Coefficient," *J. Japan Inst. Metals*, The Japan Institute of Metals and Materials, vol. 62, No. 7, dated 1998, pp. 675-680 (6 pages).
Japanese Office Action (Application No. 2014-524818) dated Mar. 15, 2016 (with English translation).

* cited by examiner

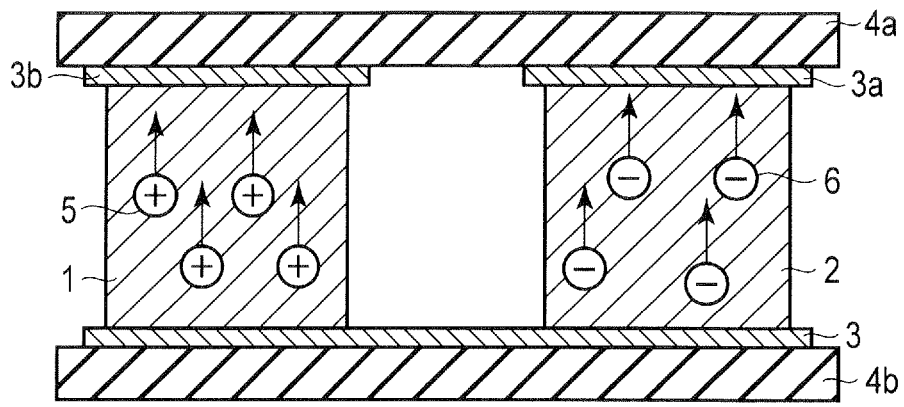
F I G. 1
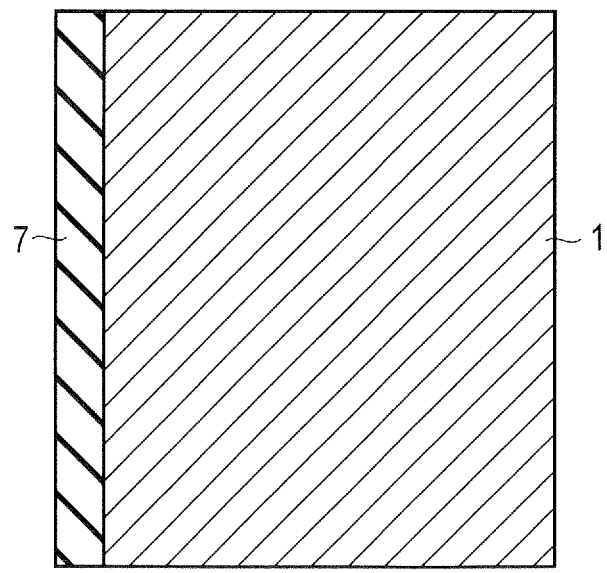
F I G. 2

THERMOELECTRIC CONVERSION MATERIAL, THERMOELECTRIC CONVERSION MODULE USING THE SAME, AND MANUFACTURING METHOD OF THE SAME

CROSS-REFERENCE TO RELATED APPLICATIONS

This application is a Continuation application of PCT Application No. PCT/JP2013/068739, filed Jul. 9, 2013 and based upon and claiming the benefit of priority from Japanese Patent Application No. 2012-154978, filed Jul. 10, 2012, entire contents of all of which are incorporated herein by reference.

BACKGROUND OF THE INVENTION

1. Field of the Invention

Embodiments described herein relate generally to a thermoelectric conversion material, a thermoelectric conversion module using the thermoelectric conversion material, and a manufacturing method of the thermoelectric conversion material.

2. Description of Related Art

In recent years, with growing awareness of global environmental issues, there has been an increasing interest in a thermoelectric cooling element using the Peltier effect as a CFC-free cooling device. Also, there has been an increasing interest in a thermoelectric generation device providing a power generation system using unused waste heat energy and using the Seebeck effect to reduce the amount of emission of carbon dioxide.

A performance index Z of a thermoelectric conversion material is represented by the following formula (1): $Z = \alpha^2/(\rho\kappa)$ ... (1), where $\alpha$ is the Seebeck coefficient of the thermoelectric conversion material, $\rho$ is the electric resistivity of the thermoelectric conversion material, and $\kappa$ is the thermal conductivity of the thermoelectric conversion material. Z has the dimension of an inverse of the temperature and becomes a dimensionless value when multiplied by the absolute temperature T. The ZT value is called a dimensionless performance index and thermoelectric conversion efficiency increases with a thermoelectric conversion material having an increasing ZT value. As is evident from the above formula (1), a higher Seebeck coefficient, a lower electrical resistivity, and a lower thermal conductivity are demanded of the thermoelectric conversion material.

A PbTe alloy has been used as a conventional thermoelectric conversion material, but Pb (lead) is harmful to humans. On the other hand, a half-Heusler compound having an MgAgAs type crystal phase attracts attention as a thermoelectric conversion material that can be used even at a high temperature and does not contain harmful substances at all or reduces such substances to a minimum. According to Jpn. Pat. Appin. KOKAI Publication No. 2007-173799 (Patent Literature 1), a certain improvement in the ZT value in the half-Heusler compound is achieved by the inclusion of a predetermined composition.

Also, International Publication No. WO 2006/067986 (Patent Literature 2) discloses a module structure that capitalizes on the characteristics of a half-Heusler compound having an MgAgAs type crystal phase.

CITATION LIST

Patent Literature

Patent Literature 1: Jpn. Pat. Appin. KOKAI Publication No. 2007-173799

Patent Literature 2: International Publication No. WO2006/067986

BRIEF DESCRIPTION OF DRAWINGS

FIG. 1 is a diagram showing an example of a thermoelectric conversion module according to an embodiment.

FIG. 2 is a diagram showing an example of a thermoelectric conversion material according to an embodiment.

DETAILED DESCRIPTION OF THE INVENTION

Figure 3:
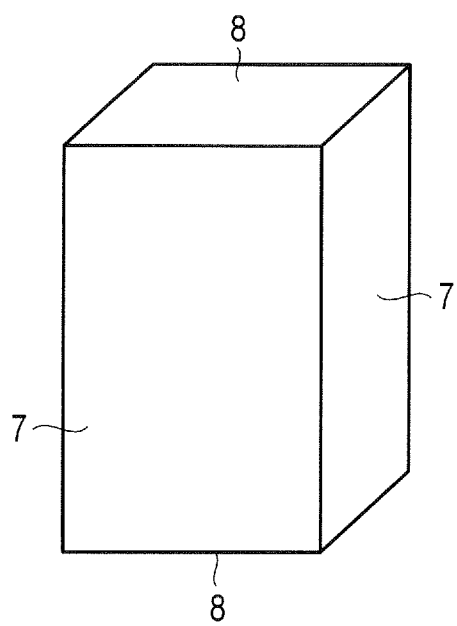
FIG. 3 is a diagram showing another example of the thermoelectric conversion material according to an embodiment.

Reliability improvements of a thermoelectric module have been confirmed by, as described in Patent Literature 2, joining a thermoelectric conversion material (half-Heusler compound) and an electrode plate with a brazing filler metal made of an active metal. Incidentally, the thermoelectric module is used, as described in [0054] and [0055] of Patent Literature 2, in various kinds of equipment such as power generation systems utilizing waste heat of garbage furnaces, various kinds of incinerators, heating furnaces, and melting furnaces, automobile engines, and boilers of thermal power plants.

Depending on the equipment in which the thermoelectric module is installed, the thermoelectric module is used for a long time. Therefore, development of a thermoelectric conversion material and a thermoelectric conversion module offering higher reliability for a long period of time is demanded.

The present invention is intended to address such a problem and an object thereof is to provide a thermoelectric conversion material with improved heat resistance and long-term reliability, a thermoelectric conversion module using the thermoelectric conversion material, and a manufacturing method of the thermoelectric conversion material.

According to an embodiment, a thermoelectric conversion material made of a polycrystalline material represented by a composition formula (1) shown below and having an MgAgAs type crystal structure is provided. An insulating coat is provided on at least one surface of the polycrystalline material.

General formula: $(A_{a1}Ti_{b1})_x D_y X_{100-x-y}$  Composition formula (1)

(In the composition formula (1) shown above, $0.2 \leq a1 \leq 0.7$, $0.3 \leq b1 \leq 0.8$, $a1+b1=1$, $30 \leq x \leq 35$, and $30 \leq y \leq 35$ hold. A is at least one element selected from the group consisting of Zr and Hf, D is at least one element selected from the group consisting of of Ni, Co, and Fe, and X is at least one element selected from the group consisting of Sn and Sb.).

The insulating coat is preferably provided on the surfaces other than an electrode joint surface of the polycrystalline material. Also, surface roughness Ra of a surface of the polycrystalline material, which is to be coated by the insulating coat, is preferably 0.2 μm or more. The insulating coat preferably includes a metallic oxide as a main component thereof. The main component of the insulating coat preferably includes at least one component selected from silicon oxide, iron oxide, and chromium oxide. Further, an average thickness of the insulating coat is preferably 3 μm or more. The electrode joint surface of the polycrystalline material preferably has a metal film formed thereon.

A thermoelectric conversion module uses the thermoelectric conversion material according to an embodiment.

A manufacturing method of a thermoelectric conversion material includes a step of preparing the thermoelectric conversion material made of a polycrystalline material represented by a composition formula (1) shown below and having an MgAgAs type crystal structure and a step of forming an insulating coat on at least one surface of the thermoelectric conversion material.

General formula: $(A_{a1}Ti_{b1})_xD_yX_{100-x-y}$   Composition formula (1)

(In the composition formula (1) shown above, $0.2 \leq a1 \leq 0.7$, $0.3 \leq b1 \leq 0.8$, $a1+b1=1$, $30 \leq x \leq 35$, and $30 \leq y \leq 35$ hold. A is at least one element selected from the group consisting of Zr and Hf, D is at least one element selected from the group consisting of Ni, Co, and Fe, and X is at least one element selected from the group consisting of Sn and Sb.)

The step of forming the insulating coat is preferably a step of providing the insulating coat on the surfaces other than an electrode joint surface. Also, after the step of forming the insulating coat, it is preferable to plate the electrode joint surface with metal or to form an evaporated film on the electrode joint surface.

A thermoelectric conversion material according to an embodiment is provided with an insulating coat on at least one surface, thus heat resistance can be improved. Therefore, degradation can be prevented and long-term reliability of a thermoelectric conversion module can be improved. In addition, a manufacturing method of a thermoelectric conversion material according to an embodiment can efficiently obtain a thermoelectric conversion material according to an embodiment.

According to an embodiment, a thermoelectric conversion material made of a polycrystalline material represented by the composition formula (1) shown below and having an MgAgAs type crystal structure is provided. An insulating coat is provided on at least one surface of the polycrystalline material.

General formula: $(A_{a1}Ti_{b1})_xD_yX_{100-x-y}$   Composition formula (1)

(In the composition formula (1) shown above, $0.2 \leq a1 \leq 0.7$, $0.3 \leq b1 \leq 0.8$, $a1+b1=1$, $30 \leq x \leq 35$, and $30 \leq y \leq 35$ hold. A is at least one element selected from the group consisting of Zr and Hf, D is at least one element selected from the group consisting of Ni, Co, and Fe, and X is at least one element selected from the group consisting of Sn and Sb.)

In the composition formula (1), the A element is at least one element selected from the group consisting of Zr (zirconium) and Hf (hafnium). Each of the A element, Ti and the X element is an element needed to make a phase having the MgAgAs type crystal structure the main phase, and Ti and the X element are described later. It is preferable to contain both of Zr and Hf to improve thermoelectric conversion characteristics. When both of Zr and Hf are contained, it is preferable to set the atomic ratio of Zr and Hf to the range of Zr/Hf atomic ratio of from 0.3 to 0.7. To reduce the cost, it is preferable to set the Hf/Zr atomic ratio to 0.1 or less.

Because Ti (titanium) is inexpensive in price when compared with Zr and Hf, the cost of the thermoelectric conversion material can be reduced by replacing a portion of the A element with Ti. In addition, the effect of reducing thermal conductivity can be achieved by containing Ti.

The X element is at least one of Sn (tin) and Sb (antimony). It is preferable to contain both of Sn and Sb to improve thermoelectric conversion characteristics.

The D element is at least one element selected from the group consisting of Ni (nickel), Co (cobalt), and Fe (iron). The D element is an element that is effective in stabilizing the phase of the MgAgAs type crystal structure. Among these elements, Ni or Co is preferable, as characteristic control of the P-type and the N-type and further, corrosion resistance are improved.

The atomic ratios of each element are $0.2 \leq a1 \leq 0.7$, $0.3 \leq B1 \leq 0.8$, $a1+B1=1$, $30 \leq x \leq 35$, and $30 \leq y \leq 35$. If the atomic ratio deviates from the above range, the phase of the MgAgAs type crystal structure cannot be stabilized and sufficient thermoelectric characteristics cannot be obtained. The composition formula (1) shows the average values when the composition of 0.1 g or more of a sample piece of the thermoelectric conversion material is examined.

It is preferable to adopt the composition rich in Ni as the D element and also rich in Sn as the X element when an N-type thermoelectric conversion material is to be produced and it is also preferable to adopt the composition rich in Co as the D element and also rich in Sb as the X element when a P-type thermoelectric conversion material is to be produced.

A thermoelectric conversion material according to an embodiment can include MgAgAs type crystal grains in 90% or more as the area ratio. That is, other phases may be present to a level of 10% or less. MgAgAs type crystal grains occupy preferably 93% or more as the area ratio and further preferably 96% or more. In addition to constituent elements of the composition formula (1), 2000 wtppm or less of metallic impurities may be contained. When at least one element selected from the group of Ni and Co is used as the D element, main components of metallic impurities include Fe and Cr.

An embodiment is characterized in that an insulating coat is provided on at least one surface of a polycrystalline material in a thermoelectric conversion material made of the polycrystalline material represented by the composition formula (1) shown above and having an MgAgAs type crystal structure.

The mechanism of a thermoelectric conversion module will be described using FIG. 1. In FIG. 1, reference numeral 1 is a P-type thermoelectric conversion material, reference numeral 2 is an N-type thermoelectric conversion material, reference numerals 3, 3a, 3b are electrodes, reference numerals 4a, 4b are insulating substrates, reference numeral 5 is a hole, and reference numeral 6 is an electron. The undersurfaces of the P-type thermoelectric conversion material 1 and the N-type thermoelectric conversion material 2 are connected by the electrode 3 supported by the lower insulating substrate 4b. The electrodes 3b, 3a are arranged on the top surfaces of the P-type thermoelectric conversion material 1 and the N-type thermoelectric conversion material 2 respectively and the upper insulating substrate 4a is provided on the outer side thereof. The P-type thermoelectric conversion material 1 and the N-type thermoelectric conversion material 2 are arranged as a pair and a plurality of P-type thermoelectric conversion materials and a plurality of N-type thermoelectric conversion materials are structured to be alternately arranged.

A thermoelectric conversion material according to an embodiment is to be used for one of the N-type and P-type thermoelectric conversion materials of a thermoelectric module or for both. When a thermoelectric conversion material according to an embodiment is to be used for one of the N-type and P-type thermoelectric conversion materials, a Bi—Te or Pb—Te material may be used for the other. If characteristics of a thermoelectric module and harmfulness of Pb are taken into consideration, it is preferable to use a thermoelectric conversion material according to an embodiment for both of the P-type and N-type thermoelectric conversion materials.

For the insulating substrates (4a, 4b), a ceramic substrate, for example, a silicon nitride substrate whose three-point bending strength is 700 MPa or more is preferable. By using the silicon nitride substrate, heat resistance of the thermoelectric module can be improved. As the electrodes (3, 3a, 3b), a plate with good conduction such as a copper plate or an aluminum plate is preferable. It is also preferable to use a high-temperature brazing filler metal to join the electrode and the thermoelectric conversion material. The melting point of the high-temperature brazing filler metal is preferably in the range of 600 to 900° C. In addition, the joint surface may be plated with a metal or metal may be deposited on the joint surface if necessary.

A thermoelectric conversion material according to an embodiment can still be used even if the higher temperature side is in the high-temperature range of 300 to 500° C. When used, for example, in a high-temperature environment of 500° C., the brazing filler metal will melt if the melting point of the brazing filler metal is not 600° C. or higher, damaging the module.

Next, the principle of a thermoelectric conversion module will be described. A temperature difference is provided such that the lower insulating substrate 4b is on the higher-temperature side and the upper insulating substrate 4a is on the lower-temperature side. In this case, the holes 5 having a positive charge move to the low-temperature side (upper side) inside the P-type thermoelectric conversion material 1. Inside the N-type thermoelectric conversion material 2, on the other hand, the electrons 6 having a negative charge move to the low-temperature side (upper side). As a result, a potential difference arises between the electrode 3b on the P-type thermoelectric conversion material 1 and the electrode 3a on the N-type thermoelectric conversion material 2. Using this phenomenon, heat can be converted into electricity or electricity can be converted into heat.

Also, heat resistance characteristics are improved by using the aforementioned brazing filler metal or silicon nitride substrate so that superior characteristics can be exhibited even in a high-temperature environment close to 500° C. or in a high-load environment in which the difference in temperature between the low-temperature side and the high-temperature side is 100° C. or higher.

While a module structure including a P-type and N-type pair is illustrated in FIG. 1, the module size may be made larger by combining a plurality of such P-type and N-type pairs.

Next, an example of the thermoelectric conversion material according to an embodiment is shown in FIGS. 2 and 3. In these figures, reference numeral 1 is a P-type thermoelectric conversion material, reference numeral 7 is an insulating coat, and reference numeral 8 is a metal film. The thermoelectric conversion material is illustrated in FIGS. 2 and 3 by using a P-type thermoelectric conversion material, but an N-type thermoelectric conversion material can also be applied in the same manner.

First, as shown in FIG. 2, the insulating coat 7 is provided on at least one surface of the thermoelectric conversion material 1. The thermoelectric conversion material is used, as shown in FIG. 1, by the top surface and the undersurface as electrode joint surfaces being joined to an electrode plate. The insulating coat 7 is preferably provided on a surface not joined to an electrode plate, that is, on a side face. If heat resistance is taken into consideration, it is preferable to provide the insulating coat on all surfaces excluding the electrode joint surfaces, that is, side faces. The thermoelectric conversion material shown in FIG. 3 is an example having a quadrangular prism shape in which the top surface and the undersurface as electrode joint surfaces are formed from the metal film 8 and the insulating coat 7 is provided on four side faces other than the electrode joint surfaces.

The main component of the insulating coat is preferably a metallic oxide. An insulating resin can also be used as the insulating coat. However, if the high-temperature side rises to 300° C. or higher as a usage environment of the thermoelectric conversion module, there is the possibility for the resin to degrade in a high-temperature environment. Therefore, the main component of the insulating coat is preferably a metallic oxide. As the main component of the insulating coat, silicon oxide, iron oxide, chromium oxide, aluminum phosphate, aluminum oxide, and zirconium oxide can be cited. The main component is a component that exhibits 50% by mass or more as the mass ratio in the insulating coat. Such metallic oxide preferably occupies 50% by mass or more and further preferably 80% by mass or more. While one kind of metallic oxide is set as the main component, another component may be added as a second component. The metallic oxide may comprise composite oxides. The melting point of such metallic oxide is 1200° C. or higher and thus, superior characteristics can be obtained even in a usage environment in which the high-temperature side of the thermoelectric module rises to 300° C. or higher and further, to 400 to 650° C.

Among these components, the insulating coat is preferably made of at least one component selected from silicon oxide, iron oxide, and chromium oxide. Such metallic oxides possess heat resistance in a high-temperature environment and are highly adherent to the thermoelectric conversion materials satisfying the composition formula (1) and thus are preferable materials. Also, an insulating coat containing at least one from silicon oxide, iron oxide, and chromium oxide preferably has a thermal expansion coefficient of $7 \times 10^{-6}$ to $12 \times 10^{-6}$/° C. This is close to that of the thermoelectric conversion material satisfying the composition formula (1), which makes film peeling less likely.

The insulating coat preferably has an average thickness of 3 μm or more. If the thickness of the insulating coat is less than 3 μm, the insulating coat is too thin to have an adequate effect of improving heat resistance. On the other hand, while heat resistance is improved by increasing the thickness of the insulating coat, if the insulating coat is too thick, not only is an increase in cost caused, but there is also the possibility of peeling due to excessive distortion, despite the similarity of thermal expansion coefficients. Thus, the average thickness of the insulating coat is preferably 3 μm or more and 1 mm or less and further preferably 5 μm or more and 0.5 mm or less.

In addition, the surface roughness Ra of the surface on which the insulating coat is formed of a polycrystalline material is preferably 0.2 μm or more. If the surface of the polycrystalline material is rough with the surface roughness Ra of 0.2 μm or more, an anchor effect with the insulating coat is obtained and adhesion to the insulating coat is improved. Thus, the surface roughness Ra of the polycrystalline material is preferably 0.2 μm or more and further preferably 0.3 to 5 μm.

The surface roughness Ra of the polycrystalline material (thermoelectric conversion material) provided with an insulating coat can be measured by taking an enlarged photo of any cross section of the polycrystalline coat provided with the insulating coat. The surface roughness Ra can be measured by analyzing an image of the surface of the polycrystalline material on the boundary between the polycrystalline material and the insulating coat in the enlarged photo. The magnification of the enlarged photo should be at least 2000 times.

The electrode joint surface of the polycrystalline material preferably includes a metal film. As shown in FIG. 1, the top surface and the undersurface of the thermoelectric conversion material made of the polycrystalline material are joined to electrodes. The thermoelectric conversion material satisfying the composition formula (1) has poor wettability due to the composition of the high-temperature brazing filler metal, thus a metal film is preferably provided on the electrode joint surface. Ni (nickel) or Au (gold) is preferable as the metal film. Ni and Au have high wettability with the thermoelectric conversion material satisfying the composition formula (1) and so a highly adherent metal film can be formed. Also, by increasing the thickness of the metal film to 1 μm or more, a high-temperature brazing filler metal can be prevented from diffusing to the thermoelectric conversion material when the thermoelectric conversion material is joined to an electrode via the high-temperature brazing filler metal.

By forming the thermoelectric conversion module using the thermoelectric conversion material as described above, heat resistance can be improved and also the bonding strength to the electrode can be increased, and therefore, long-term reliability can significantly be improved. This is particularly effective when a large thermoelectric conversion module is created by using a plurality of P-type and N-type pairs. Therefore, the thermoelectric conversion module can be used in various kinds of equipment such as power generation systems utilizing waste heat of garbage furnaces, various kinds of incinerators, heating furnaces, and melting furnaces, automobile engines, and boilers of thermal power plants.

Next, the manufacturing method of a thermoelectric conversion material according to an embodiment will be described. The manufacturing method of a thermoelectric conversion material according to an embodiment is not particularly limited, but the next manufacturing method can be cited as an efficient method.

The manufacturing method of a thermoelectric conversion material according to an embodiment includes a step of preparing a polycrystalline material represented by the composition formula (1) shown above and having an MgAgAs type crystal structure to obtain a thermoelectric conversion material and a step of forming an insulating coat on at least one surface of the thermoelectric conversion material.

General formula: $(A_{a1}Ti_{b1})_x D_y X_{100-x-y}$    Composition formula (1)

(In the composition formula (1) shown above, $0.2 \leq a1 \leq 0.7$, $0.3 \leq b1 \leq 0.8$, $a1+b1=1$, $30 \leq x \leq 35$, and $30 \leq y \leq 35$ hold. A is at least one element selected from the group consisting of Zr and Hf, D is at least one element selected from the group consisting of Ni, Co, and Fe, and X is at least one element selected from the group consisting of Sn and Sb.)

First, in the step of preparing a polycrystalline material represented by the composition formula (1) and having an MgAgAs type crystal structure, a step of preparing a raw material molten metal satisfying the composition formula (1) is performed. In the step of preparing the raw material molten metal, the raw material molten metal is prepared by mixing and melting the A element, Ti, the D element, and the X element so as to be like the intended composition formula (1). When producing a molten metal of raw material powder, a melting method such as arc melting, high-frequency melting or the like is preferable. Next, a step of pulverization is performed. For the pulverization, a method of obtaining powder by producing a raw material ingot and pulverizing the ingot by a hammer mill, a pin mill, or a jet mill and a method of obtaining powder by a process of rapid cooling from a molten metal state, similar to gas atomizing, can be cited. The average grain size obtained depends on the pulverization method, such as 20 to 50 μm by the hammer mill or pin mill, 1 to 10 μm by the jet mill, and 20 to 80 μm by the gas atomizing method.

Next, a step of molding the obtained raw material powder is performed. As the molding step, die molding and sheet molding can be cited. Also in the molding step, an organic binder such as PVA is to be used if necessary.

Next, a step of sintering the obtained molded body is performed. As the sintering method, pressureless sintering, sintering in a controlled atmosphere, the hot press method, the SPS (Spark plasma sintering) method, and the HIP (hot isostatic pressing) method can be cited. In the hot press method, the same die may be used for molding and sintering. From the viewpoint of inhibiting oxidation of a sintered body, the sintering step is preferably performed in an inert atmosphere such as, for example, Ar.

The sintering temperature is preferably 950° C. or higher and 1550° C. or lower, the sintering time is 0.5 h or longer and 50 h or shorter, and if pressure is applied during sintering, the sintering pressure is preferably 10 MPa or higher and 200 MPa or lower.

It is preferable to sinter such that the density of the obtained sintered body has a relative density of 98% or more. The density of a sintered body can be determined by dividing a measured value by the method of Archimedes by a theoretical density, and followed by multiplying the resultant value by 100%.

The shape of the sintered body can be any of various shapes, such as a cylindrical shape and a rectangular parallelopiped shape. The surface of a sintered body may be polished if necessary. Multiple molding that cuts out a plurality of thermoelectric conversion materials by cutting a sintered body may also be performed.

As dimensions of the thermoelectric conversion material when mounted on a thermoelectric module described later, for example, a cylindrical shape with an outside diameter of 0.5 to 10 mm and thickness of 1 to 30 mm and a rectangular parallelopiped shape measuring 0.5 to 10 mm per side and thickness of 1 to 30 mm can be cited.

Next, the step of forming an insulating coat on at least one surface of the thermoelectric conversion material made of the obtained sintered body (polycrystalline material) is performed. The step is preferably a step of providing the insulating coat on surfaces other than the electrode joint surface.

Methods of performing the step of providing the insulating coat include an application method after mixing metallic oxide powder in a solvent, an immersion method, and a spray method. The application method is executed by using a brush, a writing brush, a roll or the like. The immersion method is a method of immersing in a solvent mixed with metallic oxide powder. The spray method is a method of using a spray gun. The application method or the spray method is preferable because it is necessary to provide the insulating coat on all surfaces other than the electrode joint surface. When silicon oxide is used as a metallic oxide, silicon oxide powder or colloidal silica may be used. Metallic oxide powder whose average grain size of 1 to 50 μm is preferable. If the average grain size is less than 1 μm, the grain size is too small and there is the possibility of an increased load in the manufacturing process such as an increased number of applications to provide an insulating coat of a fixed thickness. If the average grain size exceeds 50 μm, there is the possibility of a gap being easily formed inside the metallic oxide coat. After the application method, the immersion method, or the spay method is executed, a drying step may be performed. The drying step is preferably a heat treatment at an ordinary temperature to 600° C. When an insulating coat is air dried, the insulating coat may be left at ordinary temperature. To accelerate the drying step, it is preferable to provide heating up to 50 to 600° C.

Next, after the step of forming the insulating coat, it is preferable to plate the electrode joint surface with metal or form an evaporated film on the electrode joint surface. In the manufacturing method according to an embodiment, an insulating coat is provided in advance and thus, no metal film is formed other than on the electrode joint surface both of the step of plating and the step of evaporating. Therefore, a defect is less likely to arise when a metal film is provided. Ni or Au is preferable as the material of a metal film.

According to the manufacturing method described above, thermoelectric conversion materials in which an insulating coat is formed with high yields can be manufactured.

EXAMPLES

A raw material molten metal is prepared by using a high-frequency induction heating process and raw material powder whose average grain size is 40 to 50 μm by the gas atomizing method. Next, the powder is mixed with PVA 1 wt % and then molded and sintered to produce a sintered body (polycrystalline material) of 3 mm (length)×3 mm (width)×5 mm (height). The composition of each sintered body is as shown in Table 1. The thermal expansion is within the range of $7 \times 10^{-6}$ to $12 \times 10^{-6}$/° C. in all cases. Also, the area ratio of the half-Heusler phase (MgAgAs type crystal grains) occupied in the structure is 95% or more in all cases.

TABLE 1

|  | Composition | P/N |
| --- | --- | --- |
| Sample 1 | $Ti_{0.4}Zr_{0.4}Hf_{0.2}CoSn_{0.12}Sb_{0.88}$ | P-TYPE |
| Sample 2 | $Ti_{0.5}Zr_{0.3}Hf_{0.2}CoSn_{0.10}Sb_{0.90}$ | P-TYPE |
| Sample 3 | $Ti_{0.25}Zr_{0.5}Hf_{0.25}NiSn_{0.994}Sb_{0.006}$ | N-TYPE |
| Sample 4 | $Ti_{0.35}Zr_{0.45}Hf_{0.20}NiSn_{0.99}Sb_{0.01}$ | N-TYPE |

As shown in Table 2, the surface roughness Ra of the side face of the sintered body is adjusted, insulating coats (main components are shown) are provided on side faces, and metal films are provided on electrode joint surfaces. The insulating coat is provided by applying a paste obtained by mixing a metallic oxide powder whose average grain size is 2 to 20 μm and a solvent and drying the paste (heat treatment temperature: 150 to 400° C.). The metallic oxide powder as the main component occupying 80 to 90% by mass and one component selected from aluminum oxide, zirconium oxide, and iron oxide occupying the remainder are mixed. The metal film is provided by the plating method. Example 3 means that 3 μm of an Ni film and 1 μm of an Au film are provided.

TABLE 2

|  | Sample | Surface roughness Ra(μm) | Insulating coat Material (main component) | Insulating coat Film thickness (μm) | Metal film Material | Metal film Film thickness (μm) |
| --- | --- | --- | --- | --- | --- | --- |
| Example 1 | Sample 1 | 0.2 | $SiO_2$ | 10 | Ni | 5 |
| Example 2 | Sample 1 | 0.3 | $Cr_2O_3$ | 5 | Ni | 3 |
| Example 3 | Sample 2 | 0.5 | $SiO_2$ | 4 | Ni/Au | 3/1 |
| Example 4 | Sample 2 | 0.6 | $SiO_2$ | 100 | Ni/Au | 2/0.5 |
| Example 5 | Sample 3 | 0.7 | $SiO_2$ | 500 | Ni | 4 |
| Example 6 | Sample 3 | 0.9 | $Cr_2O_3$ | 6 | Ni | 3 |
| Example 7 | Sample 4 | 1.0 | $SiO_2$ | 50 | Ni/Au | 3/1.5 |
| Example 8 | Sample 4 | 0.5 | $Cr_2O_3$ | 4 | Au | 2 |
| Example 9 | Sample 1 | 2.0 | $Al_2O_3$ | 20 | Ni | 4 |
| Example 10 | Sample 2 | 3.5 | $ZrO_2$ | 25 | Ni | 5 |
| Example 11 | Sample 3 | 2.5 | $Al_2O_3$ | 18 | Ni | 4 |
| Example 12 | Sample 4 | 4.2 | $Fe_2O_3$ | 30 | Ni | 5 |
| Comparative Example 1 | Sample 1 | 0.3 | — | — | — | — |
| Comparative Example 2 | Sample 3 | 0.3 | — | — | — | — |

Next, the P-type thermoelectric conversion material in Examples 1 to 4, 9, and 10 and the N-type thermoelectric conversion material in Examples 5 to 8, 11, and 12 are combined as shown in Table 3 to form thermoelectric conversion modules. In addition, Comparative Example 1 and Comparative Example 2 are combined to form a thermoelectric conversion module as a comparative example.

Incidentally, a silicon nitride substrate is used as the insulating substrate, a copper plate as the electrode plate, and a high-temperature brazing filler metal (melting point: 700° C.) is used to join the electrode plate and the thermoelectric conversion material.

TABLE 3

| Thermoelectric conversion module | P-TYPE | N-TYPE | Number of device pairs |
| --- | --- | --- | --- |
| Example A | Example 1 | Example 5 | 50 |
| Example B | Example 2 | Example 6 | 100 |
| Example C | Example 3 | Example 7 | 30 |
| Example D | Example 4 | Example 8 | 200 |
| Example E | Example 9 | Example 11 | 160 |
| Example F | Example 10 | Example 12 | 80 |
| Comparative Example A | Comparative Example 1 | Comparative Example 2 | 100 |

The high-temperature side is set to 500° C. and the low-temperature side to 50° C. for each thermoelectric conversion module and the output value after 1000 h relative to the initial output is compared. The results are shown in Table 4.

TABLE 4

| Thermoelectric conversion module | Output value (1000 h/initial value) |
|---|---|
| Example A | 0.98 |
| Example B | 0.95 |
| Example C | 0.93 |
| Example D | 0.97 |
| Example E | 0.96 |
| Example F | 0.96 |
| Comparative Example A | 0.82 |

As is evident from the table, thermoelectric conversion modules according to the present examples are less degraded. In contrast, Comparative Example A is significantly degraded. Therefore, thermoelectric conversion modules according to the present examples are superior in long-term reliability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A thermoelectric conversion material made of a polycrystalline material represented by a composition formula (1) shown below and having an MgAgAs type crystal structure, $$(A_{a1}Ti_{b1})_x D_y X_{100-x-y},\quad\text{composition formula (1):}$$

wherein $0.2 \leq a1 \leq 0.7$, $0.3 \leq b1 \leq 0.8$, $a1+b1=1$, $30 \leq x \leq 35$, and $30 \leq y \leq 35$ hold, wherein A is at least one element selected from the group consisting of Zr and Hf, D is at least one element selected from the group consisting of Ni, Co, and Fe, and X is at least one element selected from the group consisting of Sn and Sb;

wherein an insulating coat is provided on surfaces other than an electrode joint surface of the polycrystalline material, the insulating coat including a metallic oxide as a main component thereof in an amount of 50 mass % or more as a mass ratio in the insulating coat, wherein the main component of the insulating coat includes at least one component selected from the group consisting of iron oxide and chromium oxide, and wherein the insulating coat has a thermal expansion coefficient in a range of $7\times10^{-6}$ to $12\times10^{-6}/°\text{C}.$;

wherein the electrode joint surface of the polycrystalline material has a metal film formed thereon; and wherein a surface roughness Ra of the surfaces other than the electrode joint surface of the polycrystalline material is 0.2 μm or more and 5 μm or less, and wherein an average thickness of the insulating coat is 3 μm or more and 1 mm or less.

2. The thermoelectric conversion material according to claim 1, wherein the D is at least one element selected from the group consisting of Ni and Co.

3. A thermoelectric conversion module comprising the thermoelectric conversion material according to claim 1.

4. A method of manufacturing a thermoelectric conversion material, comprising:

preparing a thermoelectric conversion material made of a polycrystalline material represented by a composition formula (1) shown below and having an MgAgAs type crystal structure, $$(A_{a1}Ti_{b1})_x D_y X_{100-x-y},\quad\text{composition formula (1):}$$

wherein $0.2 \leq a1 \leq 0.7$, $0.3 \leq b1 \leq 0.8$, $a1+b1=1$, $30 \leq x \leq 35$, and $30 \leq y \leq 35$ hold, wherein A is at least one element selected from the group consisting of Zr and Hf, D is at least one element selected from the group consisting of Ni, Co, and Fe, and X is at least one element selected from the group consisting of Sn and Sb; and forming an insulating coat on at least one surface of the thermoelectric conversion material, wherein the insulating coat includes a metallic oxide as a main component thereof in an amount of 50 mass % or more as a mass ratio in the insulating coat, wherein the main component of the insulating coat includes at least one component selected from the group consisting of iron oxide and chromium oxide, and wherein the insulating coat has a thermal expansion coefficient in a range of $7\times10^{-6}$ to $12\times10^{-6}/°\text{C}.$;

wherein the step of forming the insulating coat comprises providing the insulating coat on surfaces other than an electrode joint surface; and wherein a surface roughness Ra of the surfaces other than the electrode joint surface of the polycrystalline material is 0.2 μm or more and 5 μm or less, and wherein an average thickness of the insulating coat is 3 μm or more and 1 mm or less.

5. The method of manufacturing a thermoelectric conversion material according to claim 4, wherein after the insulating coat is formed, the electrode joint surface is plated with a metal film comprising at least one of Ni and Au and having a thickness of 1 μm or more, or an evaporated film comprising at least one of Ni and Au and having a thickness of 1 μm or more is formed on the electrode joint surface.

* * * * *